US012808728B2

(12) United States Patent
Debasu et al.

(10) Patent No.: US 12,808,728 B2
(45) Date of Patent: Nov. 24, 2026

(54) INTEGRATED OPTICAL NANOTHERMOMETRY FOR REAL-TIME WAFER TEMPERATURE MONITORING DURING PROCESSING

(71) Applicant: Tokyo Electron Limited, Tokyo (JP)

(72) Inventors: Mengistie Debasu, Austin, TX (US); Kate Abel, Austin, TX (US); Antonio Luis Pacheco Rotondaro, Austin, TX (US); Trace Hurd, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 284 days.

(21) Appl. No.: 18/409,606

(22) Filed: Jan. 10, 2024

(65) Prior Publication Data

US 2025/0224282 A1 Jul. 10, 2025

(51) Int. Cl.
*G01K 11/12* (2021.01)
*G01K 11/20* (2006.01)
*H10P 72/00* (2026.01)

(52) U.S. Cl.
CPC .............. *G01K 11/12* (2013.01); *G01K 11/20* (2013.01); *H10P 72/0602* (2026.01)

(58) Field of Classification Search
CPC ...... G01K 11/12; G01K 11/20; H10P 72/0602
See application file for complete search history.

(56) References Cited

U.S. PATENT DOCUMENTS 4,652,143 A * 3/1987 Wickersheim ..... G01K 11/3213 374/161
5,705,821 A * 1/1998 Barton .................. G01K 11/20 250/461.1
5,775,808 A * 7/1998 Pan .................... G01K 11/3213 374/161
10,265,696 B2 * 4/2019 Yoo ...................... C12Q 1/6844
2003/0030067 A1 * 2/2003 Chen .................... C09K 11/574 257/E33.002

(Continued)

FOREIGN PATENT DOCUMENTS

JP 2001-272277 A 10/2001
JP 2007-271399 A 10/2007

(Continued)

OTHER PUBLICATIONS

"Temperature Sensors Market Size, Share & Trends Analysis Report By Application (Automotive, Consumer Electronics, Environmental, Medical, Process Industries), And Segment Forecasts To 2020", Temperature Sensors Market: Grand View Research, Inc., Semiconductors & ELECTRONICS, Report ID: 978-1-68038-495-6, 2012-2014, 60 pages (Summary only).

(Continued)

*Primary Examiner* — Nathaniel T Woodward
*Assistant Examiner* — Philip L Cotey
(74) *Attorney, Agent, or Firm* — Oblon, McClelland, Maier & Neustadt, L.L.P.

(57) ABSTRACT

Aspects of the present disclosure provide a semiconductor structure. For example, the semiconductor structure can include a wafer and luminescent thermometers formed on a surface of the wafer. The luminescent thermometers can be configured to receive incident light and emit light. The emitted light can have an intensity that depends on a temperature of a portion of the surface of the wafer where the luminescent thermometers are formed.

17 Claims, 12 Drawing Sheets

(56) References Cited

U.S. PATENT DOCUMENTS

| | | | | |
|---|---|---|---|---|
| 2006/0140248 | A1* | 6/2006 | Gotthold | G01K 11/3206 374/161 |
| 2007/0189359 | A1* | 8/2007 | Chen | B82Y 30/00 374/161 |
| 2009/0122832 | A1* | 5/2009 | Feist | C23C 4/11 374/161 |
| 2010/0124248 | A1* | 5/2010 | Patalay | H10P 72/0602 374/121 |
| 2015/0247209 | A1* | 9/2015 | Sanford | C12Q 1/686 435/6.12 |
| 2017/0248477 | A1* | 8/2017 | Zhao | C30B 29/48 |
| 2017/0306221 | A1* | 10/2017 | Koole | A61K 9/1611 |
| 2018/0195961 | A1* | 7/2018 | Earney | G01J 3/4406 |
| 2018/0259403 | A1* | 9/2018 | Patel | G01K 11/18 |
| 2018/0261481 | A1* | 9/2018 | Eto | G01K 11/32 |
| 2018/0323092 | A1* | 11/2018 | Rao | G01K 11/20 |
| 2020/0398305 | A1* | 12/2020 | Mahaffey | B05D 1/12 |
| 2022/0307919 | A1* | 9/2022 | Urakawa | G01K 11/32 |

FOREIGN PATENT DOCUMENTS

| | | | |
|---|---|---|---|
| JP | 2008-261665 | A | 10/2008 |
| JP | 2013-25248 | A | 2/2013 |

OTHER PUBLICATIONS

Carlos D. S. Brites, et al., "Lanthanide-Based Thermometers: At the Cutting-Edge of Luminescence Thermometry", Advanced Optical Materials, vol. 7, Issue 5, Dec. 5, 2018, 3 pages (Abstract only).

D. Jaque, et al., "Nanoparticles for photothermal therapies", NANOSCALE, vol. 6, Issue 16, Apr. 30, 2014, pp. 9494-9530 (Abstract only).

Bo Zhou, et al., "Controlling upconversion nanocrystals for emerging applications", Nature Nanotechnology, vol. 10, Nov. 2015, pp. 924-936.

Jean-Claude G. Bünzli, "Rising Stars in Science and Technology: Luminescent Lanthanide Materials", European Journal of Inorganic Chemistry, Nov. 9, 2017, pp. 5058-5063.

Svetlana V. Eliseeva, et al., "Lanthanide luminescence for functional materials and bio-sciences", Chemical Society Reviews (RSC Publishing), vol. 39, 2010, pp. 189-227.

Elisa Carrasco, et al., "Intratumoral Thermal Reading During Photo-Thermal Therapy by Multifunctional Fluorescent Nanoparticles", Advanced Functional Materials, vol. 25, Issue 4, Dec. 6, 2014, pp. 615-626 (Abstract only).

Jiahui Xu, et al., "Multiphoton Upconversion Enhanced by Deep Subwavelength Near-Field Confinement", NANO Letters, vol. 21, Mar. 9, 2021, pp. 3044-3051.

Minnea Tuomisto, et al., "Photon up-converting (Yb, Er)$_2$O$_3$ thin films by atomic layer deposition", Physica Status Solidi (RRL)—Rapid Research Letters, vol. 11, Issue 6, Apr. 26, 2017, 2 pages (Abstract only).

M.D. Chambers, et al., "Doped Oxides for High-Temperature Luminescence and Lifetime Thermometry", Annual Review of Materials Research, vol. 39, 2009, pp. 325-359.

Martino Bernard, et al., "Coupling of Photonic Waveguides to Integrated Detectors Using 3D Inverse Tapering", Journal of Lightwave Technology, vol. 40, No. 18, Sep. 15, 2022, pp. 6201-6206.

Chao MI, et al., "Ultrasensitive Ratiometric Nanothermometer with Large Dynamic Range and Photostability", Chemistry of Materials, vol. 31, No. 22, Nov. 5, 2019, pp. 9480-9487 (Abstract only).

Bastian Henke, et al., "Upconverting glasses for high-efficiency solar cells", Proc. Spie the International Society for Optics and Photonics, Nanoscale Photonic and Cell Technologies for Photovoltaics II, vol. 74110E, Oct. 28, 2009, 3 pages.

Xiaoyong Huang, et al., "Enhancing solar cell efficiency: the search for luminescent materials as spectral converters", Chemical Society Reviews (RSC Publishing), vol. 42, 2013, pp. 173-201.

Weifeng Yang, et al., "Lanthanide-doped upconversion materials: emerging applications for photovoltaics and photocatalysis", NANOTECHNOLOGY, vol. 25, 2014, pp. 1-16.

International Search Report and Written Opinion of the International Searching Authority issued Mar. 18, 2025 in PCT/US2024/058268, 11 pages.

* cited by examiner

INTEGRATED OPTICAL NANOTHERMOMETRY FOR REAL-TIME WAFER TEMPERATURE MONITORING DURING PROCESSING

FIELD OF THE PRESENT DISCLOSURE

The present disclosure relates to methods for measuring wafer temperature during processing in the fabrications of integrated circuits, and, more specifically, to real-time and remote monitoring of wafer temperature using luminescent nanothermometers integrated with semiconductor wafers.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Wafer temperature monitoring at every process step is critical and challenging in the semiconductor processing. Current approaches, e.g., KLA SensArray®, cannot address the growing demand for actual wafer temperature feedbacks during processing.

SUMMARY

Aspects of the present disclosure provide a remote temperature monitoring system. For example, the remote temperature monitoring system can include a process chamber configured to allow a wafer to be placed therein and a variety of processes to be performed on the wafer. The wafer can have luminescent thermometers formed on a surface thereon. The luminescent thermometers can be configured to receive incident light and emit light in response to the received incident light. The emitted light can have an intensity that depends on a temperature of a portion of the surface of the wafer where the luminescent thermometers are formed. The remote temperature monitoring system can further include an excitation source optically coupled to the process chamber. The excitation source can be configured to emit the incident light onto the surface of the wafer. The remote temperature monitoring system can further include an emission light detector optically coupled to the process chamber. The emission light detector can be configured to receive the emitted light from the surface of the wafer and generate spectral data. The remote temperature monitoring system can further include a spectral data and temperature reading analyzer coupled to the emission light detector. The spectral data and temperature reading analyzer can be configured to receive the spectral data from the emission light detector and determine the temperature of the wafer based on the spectral data.

In an embodiment, the spectral data and temperature reading analyzer can be configured to determine the temperature of the wafer by using a relation between an emission intensity ratio of two thermally-coupled excited state energy levels of an emitting center of the luminescent thermometers and Boltzmann's law. In another embodiment, the excitation source can include ultra-violet (UV), visible (Vis) and/or infrared (IR) light.

Aspects of the present disclosure also provide a semiconductor structure. For example, the semiconductor structure can include a wafer and luminescent thermometers formed on a surface of the wafer. The luminescent thermometers can be configured to receive incident light and emit light. The emitted light can have an intensity that depends on a temperature of a portion of the surface of the wafer where the luminescent thermometers are formed.

In an embodiment, the luminescent thermometers can include rare-earth (RE) ions doped oxides, fluorides, aluminates, phosphates, silicates, titanates, vanadates, borates, chlorides, oxysulfides and/or oxyfluorides. In another embodiment, the luminescent thermometers can include $Y_2O_3$:RE, $Sc_2O_3$:RE, $La_2O_3$:RE, $Gd_2O_3$:RE, $HfO_2$:RE, $ZrO_2$:RE, ZnO:RE, $Ta_2O_5$:RE, $Al_2O_3$:RE, $TiO_2$:RE, $NaYF_4$:RE, $CaF_2$:RE, $SrF_2$:RE, $YPO_4$:RE, $YBO_4$:RE, $YAlO_3$:RE, $YVO_4$:RE and/or $YCl_3$:RE, where RE denotes single or combination of different rare-earth ions. In some embodiments, the rare-earth ions can include $Y^{3+}$, $Sc^{3+}$, $La^{3+}$, $Ce^{3+}$, $Pr^{3+}$, $Nd^{3+}$, $Eu^{3+}$, $Gd^{3+}$, $Dy^{3+}$, $Tb^{3+}$, $Ho^{3+}$, $Er^{3+}$, $Tm^{3+}$, $Yb^{3+}/Er^{3+}$, $Yb^{3+}/Tm^{3+}$, $Yb^{3+}/Tm^{3+}/Er^{3+}$, $Yb^{3+}/Ho^{3+}$, $Yb^{3+}/Ho^{3+}/Er^{3+}$, $Yb^{3+}/Ho^{3+}/Tm^{3+}$ and/or $Yb^{3+}/Tb^{3+}$.

In an embodiment, the wafer can have a scribe line, a patterned feature and/or an alignment marker formed on the surface thereof, and the luminescent thermometers are formed on the surface within the scribe line, the patterned feature and/or the alignment marker, or the surface is a backside surface of the wafer. In another embodiment, at least one of the luminescent thermometers can be 1 nm to 10 micrometers in size. In some embodiments, the incident light can include ultra-violet (UV), visible (Vis) and/or infrared (IR) light. In various embodiments, the semiconductor structure can further include an encapsulation film formed on the surface of the wafer to cover the luminescent thermometers.

Aspects of the present disclosure also provide a method of forming a semiconductor structure. For example, the method can include providing a wafer and forming luminescent thermometers on a surface of a wafer. The luminescent thermometers can be configured to receive incident light and emit light. The emitted light can have an intensity that depends on a temperature of a portion of the surface of the wafer where the luminescent thermometers are formed.

In an embodiment, forming luminescent thermometers can includes attach the luminescent thermometers to the surface of the wafer through self-assembly, selective area deposition, electrostatic interactions and/or chemical bonding using surface functionalization of the luminescent thermometers and/or the wafer. In another embodiment, forming luminescent thermometers can further include modifying surface charges and functionalities of the luminescent thermometers using surface coating and ligand capping in a solvent. For example, the surface coating can include SiO2 and polymer coatings, or the ligand capping includes oleic acid and citric acid. As another example, the solvent can include isopropyl alcohol (IPA), methanol, ethanol, ethyl acetate, chloroform, or cyclohexane.

In an embodiment, the method can further include forming an encapsulation film on the surface of the wafer to cover the luminescent thermometers. In another embodiment, the luminescent thermometers can be formed using atomic layer deposition (ALD) or chemical vapor deposition (CVD) techniques. In some embodiments, the ALD technique can be achieved using rare-earth/metal precursors and oxygen and fluorine gas precursors. In various embodiments, the rare-earth/metal precursors can include rare-earth complexes of β-diketonate, alkoxides, organometallics or amides, and the oxygen and fluorine gas precursors can include $O_2$, $O_3$, $H_2O_2$ vapor, $H_2O$ vapor, or $F_2$.

The present disclosure can thus provide remote, noninvasive and actual process temperature measurements with improved spatial, temperature and temporal accuracies, improve performance by measuring process temperatures in broader ranges, reduce cost and time by avoiding temperature calibrations for different process steps and/or process conditions, enable absolute local temperature measurements with nanoscale spatial precisions in advanced technology nodes, and provide real-time wafer temperature feedbacks.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

Note that this summary section does not specify every embodiment and/or incrementally novel aspect of the present disclosure or claimed disclosure. Instead, this summary only provides a preliminary discussion of different embodiments and corresponding points of novelty over conventional techniques. For additional details and/or possible perspectives of the present disclosure and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

Figure 1A:
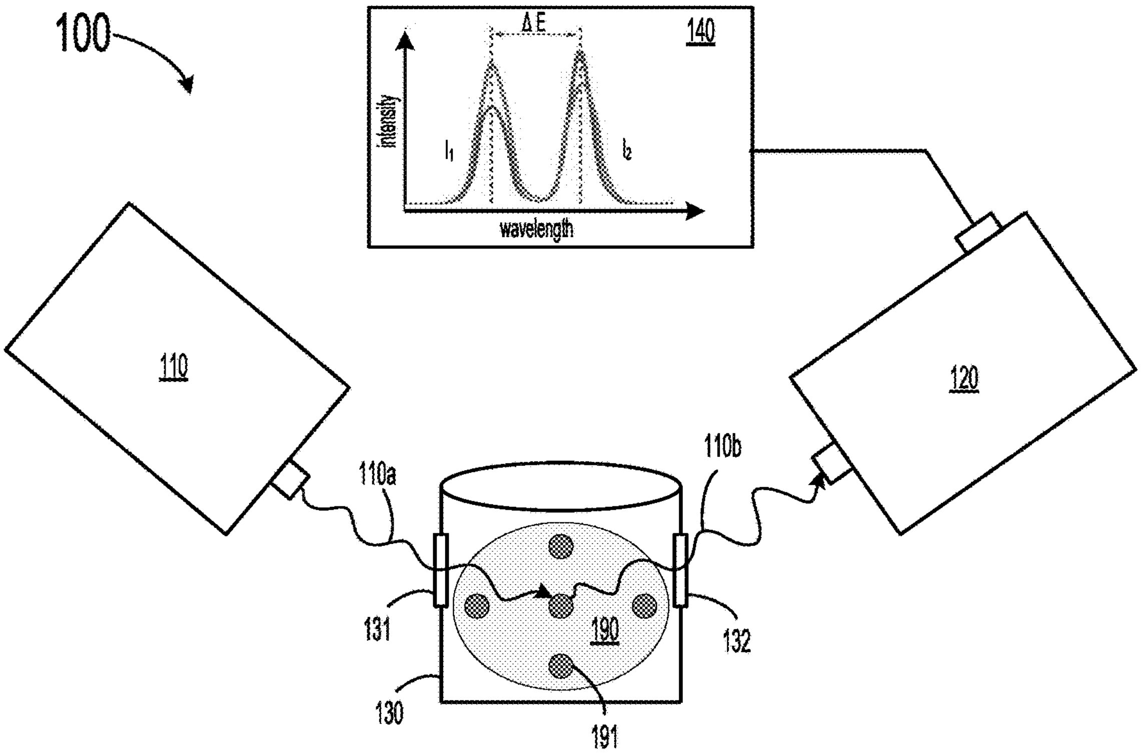
FIG. 1A is a schematic diagram of an exemplary remote wafer temperature monitoring system according to some embodiments of the present disclosure.

Wafer temperature monitoring is critical during various process steps in the fabrication of integrated circuits (ICs). Until now, the measurements and optimizations of processing temperatures have been largely relied on conventional contact thermometers such as thermocouples, resistive temperature devices (RTDs) and thermistors attached to or embedded into test wafers. However, such test wafers or wafer sensors measure the temperature of a given process condition but not the actual wafer temperature during processing. Therefore, current process optimizations are based on the correlations between the temperature data acquired by the test wafers for a particular process condition and post-process metrology results such as etch rate, surface roughness and film thickness. In general, existing wafer-based temperature sensors in the semiconductor industry suffer from several limitations and do not fulfill the growing demand for real-time monitoring of actual wafer temperature during processing. Wafer sensors (i) are unsuitable for small scale systems with spatial resolutions below 10 μm, for example, to measure local temperatures in the vicinity of nanoscale features and critical dimensions in IC fabrications, (ii) require an effective thermal contact with the object or system whose temperature need to be measured, (iii) have limited operating temperature range, e.g., due to onboard electronics, (iv) require routine temperature calibrations for different tools and process conditions (e.g., chamber to chamber, tool to tool, wafer to wafer, within wafer etc.), (v) have limited number of temperature sensors (<70) per wafer, being unable to provide accurate temperature profile across the wafer surface, and (vi) cannot operate under certain process conditions such as plasma process, high electromagnetic field, corrosive environments and rapid movements/rotations.

Aspects of the present disclosure provides solutions for the referred limitations of current wafer-based temperature sensors by utilizing luminescent nanothermometers integrated with each process (or production) wafer for real-time and remote monitoring of temperature during semiconductor processing and IC fabrication. The luminescent nanothermometers include, but not limited to nanomaterials and thin films of rare-earth (RE) ions doped oxides, fluorides, aluminates, phosphates, silicates, titanates, vanadates, borates, chlorides, oxysulfides, oxyfluorides etc. e.g., $Y_2O_3$:RE, $Sc_2O_3$:RE, $La_2O_3$:RE, $Gd_2O_3$:RE, $HfO_2$:RE, $ZrO_2$:RE, ZnO:RE, $Ta_2O_5$:RE, $Al_2O_3$:RE, $TiO_2$:RE, $NaYF_4$:RE, $CaF_2$:RE, $SrF_2$:RE, $YPO_4$:RE, $YBO_4$:RE, $YAlO_3$:RE, $YVO_4$:RE, $YCl_3$:RE etc. where RE denotes single or combination of different rare-earth ions i.e., RE=$Y^{3+}$, $Sc^{3+}$, $La^{3+}$, $Ce^{3+}$, $Pr^{3+}$, $Nd^{3+}$, $Eu^{3+}$, $Gd^{3+}$, $Dy^{3+}$, $Tb^{3+}$, $Ho^{3+}$, $Er^{3+}$, $Tm^{3+}$, $Yb^{3+}/Er^{3+}$, $Yb^{3+}/Tm^{3+}$, $Yb^{3+}/Tm^{3+}/Er^{3+}$, $Yb^{3+}/Ho^{3+}$, $Yb^{3+}/Ho^{3+}/Er^{3+}$, $Yb^{3+}/Ho^{3+}/Tm^{3+}$, $Yb^{3+}/Tb^{3+}$, etc. The size of the thermometers can range from 1 nm to a few (e.g., 10) micrometers that emit light in the visible and/or infrared spectral region upon UV, visible and/or IR light illumination sources. These types of nanothermometers can be either fabricated using existing semiconductor tools or purchased from vendors for the target applications of the present invention.

Temperature monitoring can be achieved by using the temperature dependent emission properties of the nanothermometers attached to or embedded into a process wafer. The thermometric parameter (i.e., the emission property that changes with the temperature) can be the emission intensity, intensity ratio between two distinct peaks, spectral peak position, and excited-state lifetime. An ideal thermometric parameter must vary as a function of temperature only. Therefore, thermometric parameter defined by the intensity ratio between two distinct emission bands originated from thermally coupled energy levels of a single emitting center offers self-referenced and reliable temperature reading without the influence of other factors such as concentrations, artifacts, absorption cross-section, excitation light dose, optical setup, etc. One example of such emitting center is the $Er^{3+}$ ion with two thermally coupled excited-state energy levels, namely $^2H_{11/2}$ and $^4S_{3/2}$, emitting in the visible spectral region upon UV and/or near-infrared excitations. The intensity of $Er^{3+}$ emission can be enhanced via the energy transfer process using a sensitizer, e.g., $Yb^{3+}$ ion which has strong absorption cross-section at 980 nm. The absolute temperature is determined from the thermometric parameter defined by the emission intensity ratio between the $Er^{3+}$ $^2H_{11/2} \rightarrow {}^4I_{15/2}$ and $^4S_{3/2} \rightarrow {}^4I_{15/2}$ transitions related to the Boltzmann's distribution. Other emitting centers with temperature-dependent luminescent properties include but not limited to $Eu^{3+}$, $Tm^{3+}$, $Ho^{3+}$, $Tb^{3+}$, $Eu^{3+}$, $Yb^{3+}/Tm^{3+}$, $Yb^{3+}/Ho^{3+}$, $Yb^{3+}/Tb^{3+}$, etc.

This approach is simple and straightforward for remote and real-time monitoring of wafer temperature during processing with nanoscale spatial precision, for instance, temperature profile of small feature sizes in the vicinity of the nanothermometers. The method uses inexpensive excitation light sources (e.g., near-infrared continuous wave (CW) diode laser and/or UV-Vis excitation sources including LED sources, lamps etc.) to illuminate the integrated wafer-nanothermometer platform and detection systems (e.g., photodetectors including, but not limited to CCD, CMOS and hyperspectral cameras, photomultiplier tube, and any optical detection systems e.g., existing optical spectrometers, etc.) to acquire the luminescent spectra of the nanothermometers. The luminescent spectra collected from every point of the wafer is converted to local temperatures using the relation described above. Both the excitation source and the detector can be located outside the process chamber equipped with appropriate transparent windows for the excitation and emission lights, enabling remote monitoring of process temperatures. The wafer can be either in spinning/rotation, steady-state, or translation with respect to the detector and excitation light and vice versa during temperature monitoring. Full wafer temperature mapping can be obtained by illuminating the whole wafer area containing the nanothermometers with the excitation light and by collecting the corresponding emission spectra from each pixel of the exposed area (e.g., using a hyperspectral camera or appropriate image sensor cameras).

In principle, the nanothermometers can be embedded into unused spaces of the process wafer, e.g., backside of the wafer, scribe lines and alignment markers. The method can be implemented on existing process tools with minor or no modifications. The present integrated wafer-nanothermometer platform can be used in certain process conditions and uncontrolled environments such as strong electromagnetic fields, corrosive environments, high speed motions, and cryogenic and high temperature settings where conventional contact thermometers cannot be operative due to their associated electronic components.

Different methods are presented to demonstrate the use of integrated luminescent nanothermometers for real-time and remote monitoring of wafer temperature during processing. One embodiment of the method illustrates the integration of premade luminescent nanothermometers with semiconductor wafers. Another embodiment demonstrates both the fabrication and integration of the nanothermometers using existing semiconductor tools such as ALD and CVD techniques. Both embodiments utilize the same overall principle to determine wafer temperatures during processing.

One example of luminescent intensity ratio based nanothermometry methods and their temperature sensing mechanisms is presented in FIG. 1A, which is a schematic diagram of an exemplary remote wafer temperature monitoring system 100 according to some embodiments of the present disclosure. In an embodiment, luminescent nanothermometers, e.g., $NaYF_4$:Yb/Er nanoparticles 191, can be used as a test vehicle. The methods are easy to use, operate and implement. Every production wafer can be coded with luminescent nanothermometers allowing for actual temperature monitoring during processing. Both the excitation source and detection systems (or illumination detectors) used in the methods can be noninvasive and do not require to be in contact with or installed in a process chamber/tool that has optically transparent windows for the excitation and emission lights to pass through. The system 100 can include an excitation source 110, an emission light detector 120, a process chamber 130 optically coupled to the excitation source 110 and the emission light detector 120, and a spectral data and temperature reading analyzer 140 coupled to the emission light detector 120.

The process chamber 130 can allow a wafer 190 to be placed therein and a variety of process steps, e.g., deposition and etching, to be performed on the wafer 190. The process chamber 130 can include one or more optical windows mounted on the wall thereof. For example, the process chamber 130 can include a first optical window 131 and a second optical window 132 mounted on the wall thereof opposite to each other, as shown in FIG. 1A. The first optical window 131 and the second optical window 132 can be made of an optically transparent material that allows transmission of light therethrough. As another example, the process chamber 130 can include a single optical window, e.g., a cover on the top thereof.

An excitation source 110 can be configured to form incident light beam 110*a* for substrate (e.g., the wafer 190) illumination. For example, the incident light beam 110*a* can be passed through the first optical window 131 and focused onto the surface of the wafer 190, specifically, certain illumination areas where luminescent nanothermometers, e.g., the nanoparticles 191, are attached to or embedded in. In an embodiment, the excitation source 110 can include a broadband light source such as continuous wave (CW) broadband light source, e.g., a laser driven plasma light source (LDLS) that provides light with high brightness across a broad spectrum UV (ultraviolet)-Vis (Visible)-NIR (near infrared) (i.e., 190-2000 nm). For example, the incident light beam 110*a* can be NIR light, e.g., CW 980 nm diode laser, in response with the absorption band of $Yb^{3+}$, contained in $NaYF_4$:Yb/Er nanoparticles 191 embedded in the wafer 190.

The excitation source 110 can be or can be not installed proximate to the process chamber 130. In an embodiment, the excitation source 110 can be installed remotely from the process chamber 130, and the incident light beam 110*a* can be fed into other components proximate to the processing chamber 130 by an optical fiber or a set of optical components such as mirrors, prisms and lenses.

The emission light detector 120 can be configured to receive an emitted light beam 110*b* radiated from the surface of the wafer 190, specifically, the certain illumination areas where the nanoparticles 191 are embedded, through the second optical window 132, and generate corresponding spectral data. In an embodiment, the emission light detector 120 can include a photodetector in UV-Vis spectral region (CCD, CMOS and hyperspectral cameras, and photomultiplier tube, etc.). The spectral data and temperature reading analyzer 140 can be configured to receive the spectral data remotely from the emission light detector 120 and determine the temperature of the wafer 190 by using the fundamental relation between the integrated emission intensity ratio of two thermally-coupled excited state energy levels of an emitting center(s) and Boltzmann's law. For example, the thermometric parameter, i.e., the parameter that changes with the temperature, can be defined by the integrated intensity ratio between two distinct peaks of the spectrum originated from two closely spaced energy levels, and the absolute local temperature can be determined using the Boltzmann's distribution:

$$\frac{I_1}{I_2} = B\, e^{\left(\frac{-\Delta E}{k_B \times T}\right)} \text{ and } T = \frac{\Delta E}{k_B} \times \frac{1}{\ln\left(\frac{BI_2}{I_1}\right)}.$$

Figure 1B:
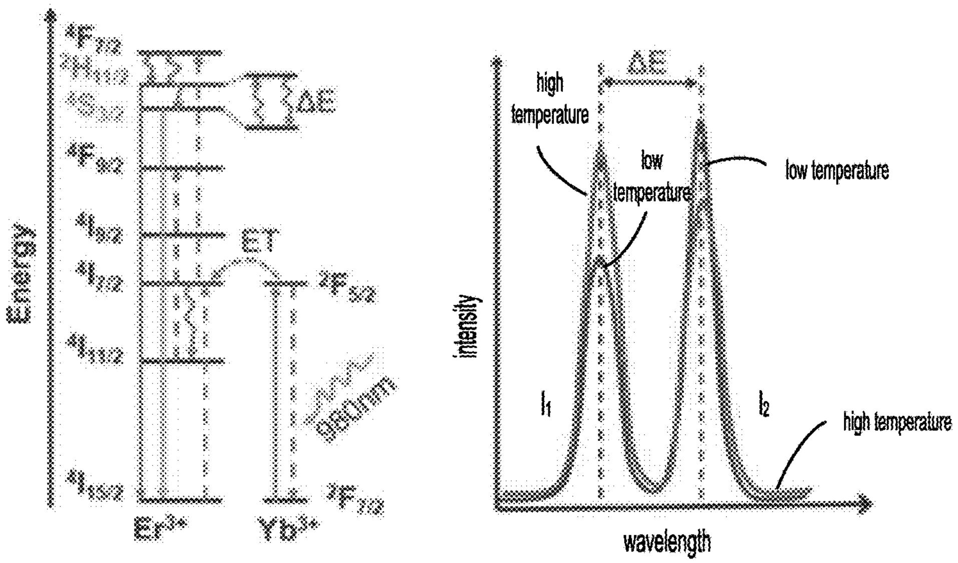
FIG. 1B is an example of the partial energy level diagrams for the emitting centers of luminescent nanothermometers and the temperature sensing mechanism, e.g., the $Yb^{3+}/Er^{3+}$ system and the $Er^{3+}$ upconversion emission of $NaYF_4$:Yb/Er nanoparticles.

FIG. 1B is an example of the partial energy level diagrams for the emitting centers of luminescent nanothermometers and the temperature sensing mechanism, e.g., the $Yb^{3+}/Er^{3+}$ system and the $Er^{3+}$ upconversion emission of $NaYF_4$:Yb/Er nanoparticles. The $Er^{3+}$ exhibits visible upconversion emission via energy transfer (ET) from the $Yb^{3+}$ excited in the near infrared at 980 nm followed by a sequential two-photon (i.e., excited state) absorption process. A multiphoton process can thus be performed according to $I \propto P^n$, where I is the integrated emission intensity, P is the laser power, and n is the number of photons involved in the emission process. The population of the two closely spaced $^2H_{11/2}$ and $^4S_{3/2}$ energy levels with the energy gap ΔE varies with temperature according to the Boltzmann's distribution and their intensity ratio $I_1/I_2$ serves as a thermometric parameter to extract the absolute temperature T; B is a pre-exponential constant; and $k_B$ is the Boltzmann's constant.

Embodiment 1: Integration of the Nanothermometers Through Surface Functionalization This method demonstrates the integration of luminescent nanothermometer arrays (e.g., composed of the nanoparticles 191) with semiconductor wafers (e.g., the wafer 190). An effective attachment of the nanothermometers to the wafer surface at selected locations can be achieved through self-assembly, selective area deposition, electrostatic interactions and/or chemical bonding using surface functionalization of the nanothermometers and/or the wafer. The surface charges and functionalities of the nanothermometers can be modified using appropriate surface coating (e.g., $SiO_2$ and polymer coatings) and ligand capping (e.g., oleic acid and citric acid) in aqueous or non-aqueous solvents (e.g., IPA, methanol, ethanol, chloroform, cyclohexane, etc.). Spin coating, dip coating and/or drop casting of the nanothermometer solution will offer selective deposition with self-assembled nanothermometer arrays on the wafer surface. The number and packing density of nanothermometers per wafer can be precisely controlled using this approach, allowing accurate measurement of full water temperature profile based on the emission spectra of the nanothermometer arrays. This method also allows to integrate the nanothermometers with unused areas and/or patterned features of the wafer, e.g., scribe lines, alignment markers, and edge and backside of the wafer. For instance, a variety of patterned features of various sizes including lines, spaces and hole arrays can be filled with the nanothermometers using self-assembly, selective area deposition and photolithography processes. In an embodiment, the nanothermometers can be selectively and precisely integrated with the desired wafer locations where the absolute local temperatures need to be determined.

Figure 2A:
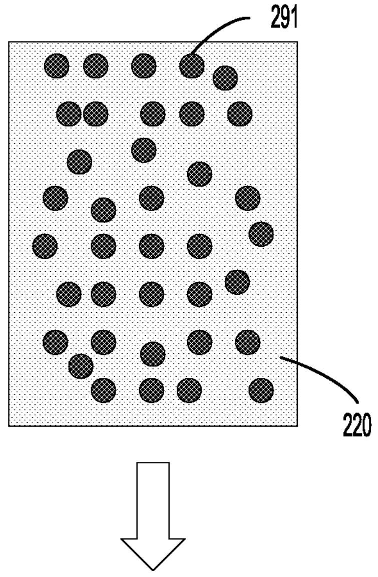
FIG. 2A shows surface functionalized nanothermometers in aqueous/non-aqueous solutions according to some embodiments of the present disclosure.
Figure 2B:
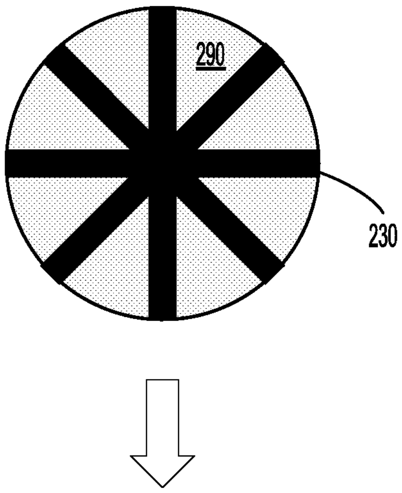
FIG. 2B shows a wafer with patterned features, e.g., scribe lines 230, spaces, and hole arrays to be filled with nanothermometers according to some embodiments of the present disclosure.
Figure 2C:
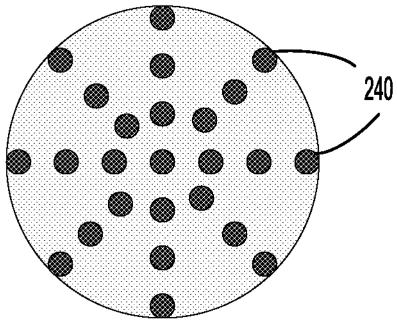
FIG. 2C shows nanothermometer arrays integrated with a wafer surface at desired locations according to some embodiments of the present disclosure.

FIG. 2A shows surface functionalized nanothermometers 291 (e.g., nanothermometers with negative surface charge) in aqueous/non-aqueous solutions 220. FIG. 2B shows a wafer 290 (e.g., the wafer 190) with patterned features, e.g., scribe lines 230, spaces, and hole arrays to be filled with the nanothermometers 291 (e.g., the nanoparticles 191). FIG. 2C shows nanothermometer arrays 240 integrated with the wafer 290 surface at the desired locations (e.g., within the scribe lines 230). The nanothermometer arrays 240 are composed of the nanoparticles 191 filled within the scribe lines 230.

Figure 3A:
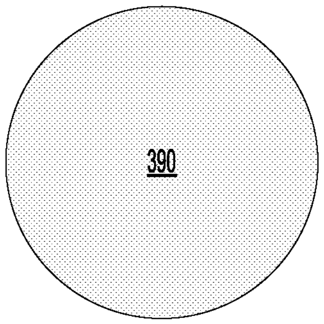
FIG. 3A shows the provision of a wafer to be integrated with luminescent thermometers according to some embodiments of the present disclosure.
Figure 3B:
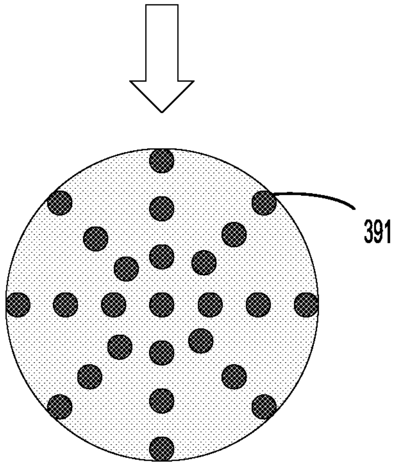
FIG. 3B shows the integration of the luminescent thermometers with the wafer 390 according to some embodiments of the present disclosure.
Figure 3C:
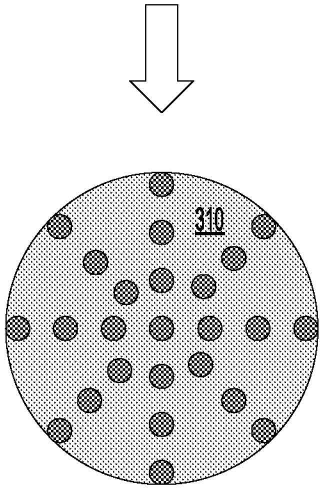
FIG. 3C shows one or more film materials formed according to some embodiments of the present disclosure.

Embodiment 2: Integration of the Nanothermometers Using Thin Film Encapsulations and Coatings Methodology This embodiment provides methods for the effective attachment and integration of the luminescent nanothermometers with production wafers through thin film encapsulation, coating and embedding using semiconductor process materials, e.g., spin-on glass, polymers, photoresists, oxides, and dielectrics. FIG. 3A shows the provision of a production wafer 390, e.g., the wafer 190, to be integrated with nanothermometers 391 (shown in FIG. 3B), e.g., the nanoparticles 191. FIG. 3B shows the integration of the nanothermometers 291 with the wafer 390. In an embodiment, the integration can be achieved using common processing methods such as spin coating, deposition, etching, photolithography, etc. For instance, the nanothermometers 391 (e.g., luminescent nanothermometer arrays) can be deposited on the wafer 390 surface through dip coating, spin coating, and/or drop casting of aqueous or non-aqueous solutions containing the nanothermometers 391 followed by the solvent evaporation. The deposited nanothermometers 391 can then be coated with the appropriate one or more thin film encapsulation materials 310, as shown in FIG. 3C, using spin coating, for example. In an embodiment, the encapsulation materials 310 can include spin-on glass, polymers, photoresists, oxides, etc.

In addition to the effective attachment and integration of the nanothermometers 391 with the wafer 390, the encapsulation/coating material 310 can provide excellent mechanical, thermal, chemical and photo stabilities and compatibilities during processing and temperature monitoring.

Embodiment 3: Fabrication of Integrated Nanothermometers

Fabrication of integrated luminescent nanothermometers (e.g., $NaYF_4$:Yb/Er, $Gd_2O_3$:Yb/Er, and $Y_2O_3$:Yb/Er) on a process wafer, e.g., the wafers 190, 290 and 390, can be achieved using current semiconductor tools such as atomic layer deposition (ALD) and chemical vapor deposition (CVD) techniques. ALD growth of luminescent nanoparticles and thin films based on rare-earth (RE) doped oxides (e.g., $Y_2O_3$:RE, $Sc_2O_3$:RE, $La_2O_3$:RE, $Gd_2O_3$:RE, $HfO_2$:RE, $ZrO_2$:RE, ZnO:RE, $Ta_2O_5$:RE, $Al_2O_3$:RE, and $TiO_2$:RE, where RE=$Y^{3+}$, $Sc^{3+}$, $La^{3+}$, $Ce^{3+}$, $Pr^{3+}$, $Nd^{3+}$, $Eu^{3+}$, $Gd^{3+}$, $Dy^{3+}$, $Tb^{3+}$, $Ho^{3+}$, $Er^{3+}$, $Tm^{3+}$, $Yb^{3+}/Er^{3+}$, $Yb^{3+}/Tm^{3+}$, $Yb^{3+}/Tm^{3+}/Er^{3+}$, $Yb^{3+}/Ho^{3+}$, $Yb^{3+}/Ho^{3+}/Er^{3+}$, $Yb^{3+}/Ho^{3+}/Tm^{3+}$, $Yb^{3+}/Tb^{3+}$, etc.) and metal fluorides ($NaYF_4$:RE, $CaF_2$:RE, and $SrF_4$:RE) can be achieved using appropriate rare-earth/metal precursors (e.g., rare-earth complexes of β-diketonate, alkoxides, organometallics, amides, etc.) and oxygen and fluorine gas precursors (e.g., $O_2$, $O_3$, $H_2O_2$ vapor, $H_2O$ vapor, $F_2$, etc.). ALD technique enables to control the size/thickness and composition of the nanothermometers with atomic scale precision by using selective and cyclic deposition process.

Figure 4A:
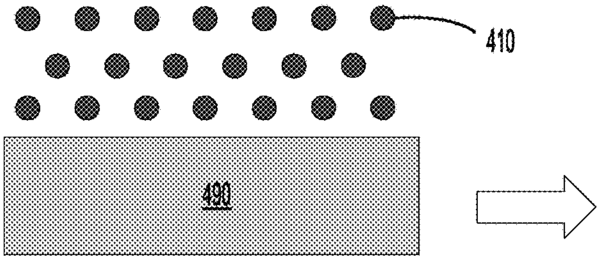
FIGS. 4A-4D show the integration of a process wafer with luminescent thermometers according to some embodiments of the present disclosure.
Figure 4B:
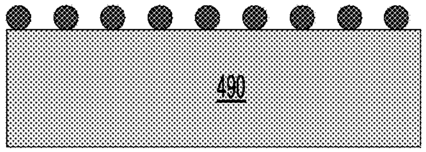
Figure 4D:
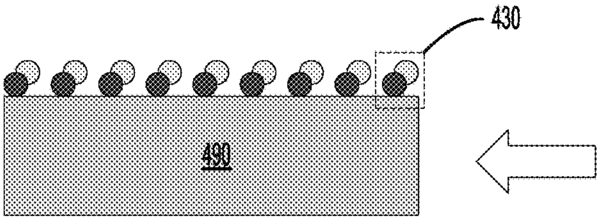
Figure 4C:
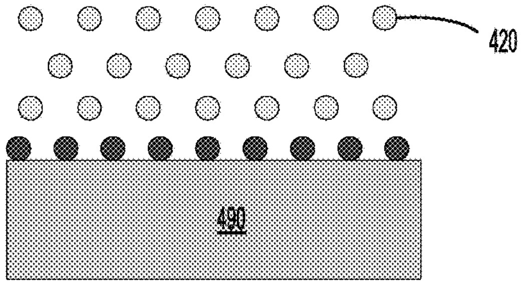

FIGS. 4A-4D are schematic diagrams illustrating ALD/CVD growth of luminescent oxide and fluoride nanoparticles/thin films according to some embodiments of the present disclosure. The target size, thickness, and location of the nanoparticles on the wafer surface can be controlled with selective and cyclic deposition process. As shown in FIG. 4A, a process wafer 490, e.g., the wafer 190, is provided, that is to be integrated with nanothermometers, and vaporized metal precursors 410 (e.g., lanthanide complexes of β-diketonate) are deposited on the process wafer 490. Then, a purge process can be performed, and the process wafer 490 integrated with the metal precursors 410 can be formed, as shown in FIG. 4B. Then, gas precursors 420 (e.g., $O_2$, $O_3$, $H_2O_2$ vapor, $H_2O$ vapor, $F_2$, etc.) can be deposited on the metal precursors 410, as shown in FIG. 4C, and luminescent oxide/fluoride nanoparticles or thin film 430 can be formed, as shown in FIG. 4D.

Figure 5A:
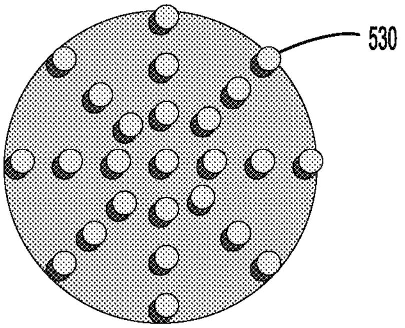
FIGS. 5A and 5B are schematic diagrams for the integration of luminescent nanothermometers with a process wafer using ALD/CVD techniques according to some embodiments of the present disclosure.
Figure 5B:
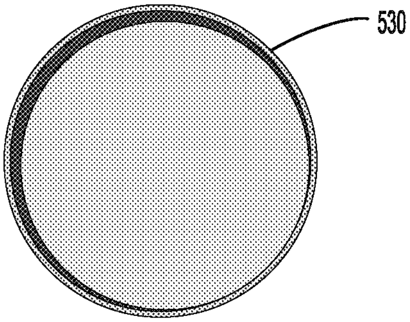

FIGS. 5A and 5B are schematic diagrams for the integration of luminescent nanothermometers with a process wafer (e.g., the wafer 190) using ALD/CVD techniques according to some embodiments of the present disclosure. For example, FIG. 5A shows the integration of the luminescent oxide/fluoride nanoparticles 530 (e.g., the luminescent oxide/fluoride nanoparticles 430, e.g., the nanoparticles 191) with the process wafer 490, e.g., the wafer 190, while FIG. 5B shows the integration of the luminescent oxide/fluoride thin film 530 (e.g., the luminescent oxide/fluoride thin film 430) with the process wafer 490.

Figure 6:
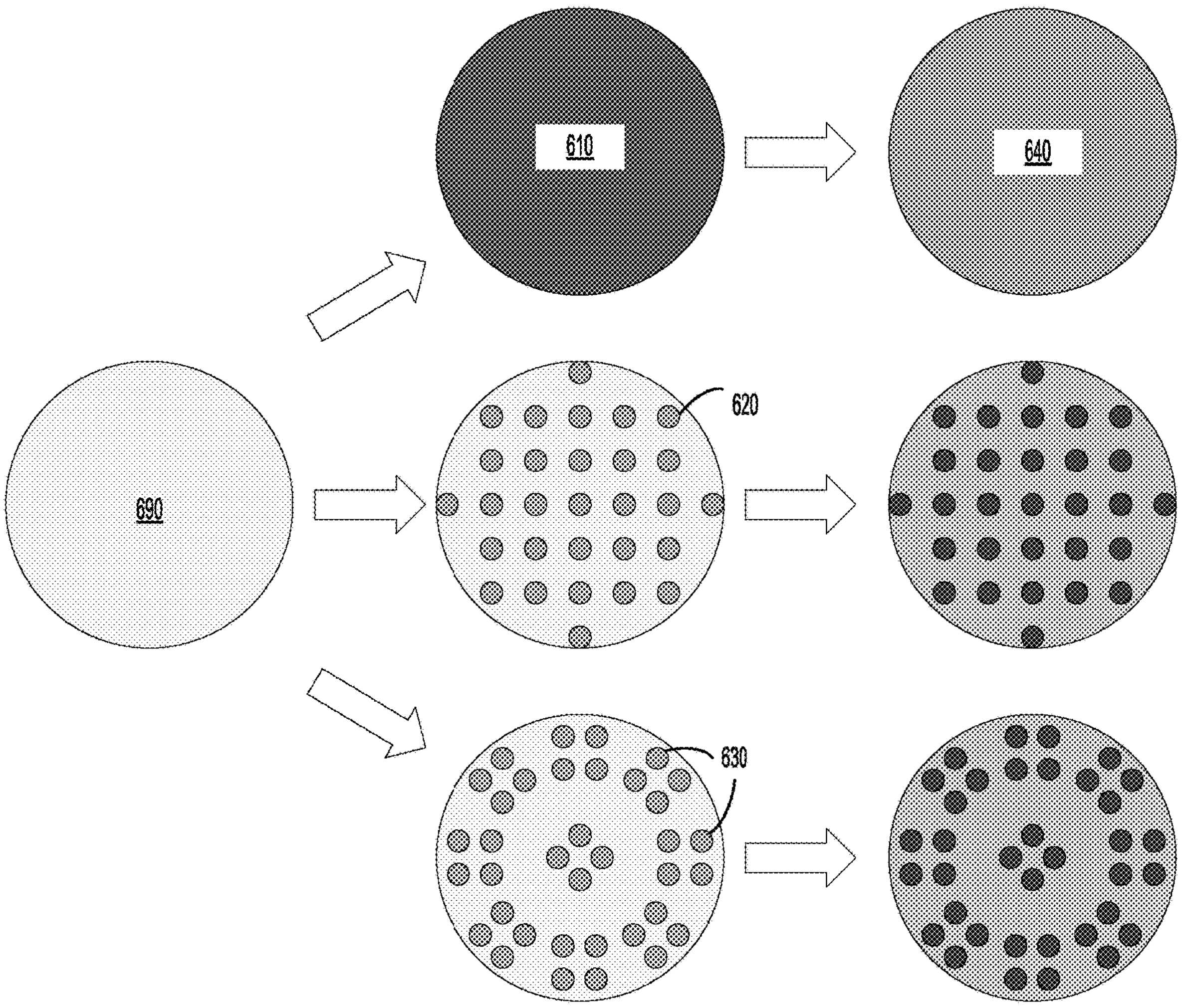
FIG. 6 is schematic representation of the different approaches for the integration of premade nanothermometers with every process wafer using, e.g., spin coating, dip coating and/or drop casting of appropriate nanothermometer solutions on the wafer surface, scribe lines or patterned features according to some embodiments of the present disclosure.

FIG. 6 is schematic representation of the different approaches for the integration of premade nanothermometers with every process wafer using, e.g., spin coating, dip coating and/or drop casting of appropriate nanothermometer solutions on the wafer surface, scribe lines or patterned features according to some embodiments of the present disclosure. For example, a wafer 690, e.g., the wafer 190, can be cleaned, functionalized, treated, modified, etc.; then thin film or powder paint of nanoparticles 610 (e.g., the nanoparticles 191), can be formed, nanoparticles 620 can be spin/dip coated or nanoparticles clusters 630 can be coated on the surface of the wafer 690, and oxide coated thin film of nanoparticles 640 can be formed using ALD/CVD process.

Figure 7A:
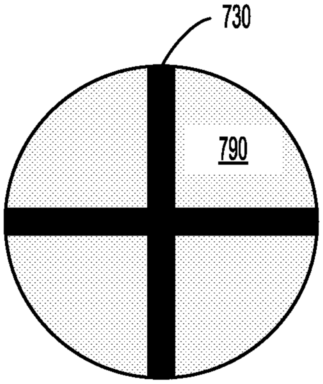
FIGS. 7A-7D are schematical diagrams illustrating the integration of luminescent thermometers with a wafer according to some embodiments of the present disclosure.
Figure 7B:
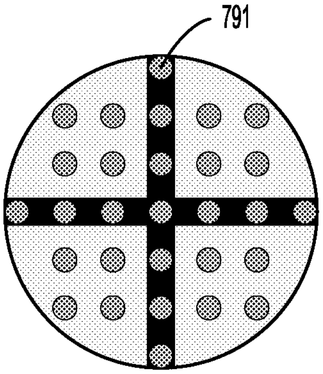
Figure 7D:
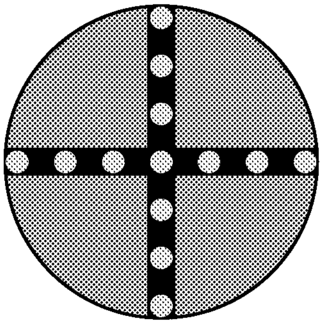
Figure 7C:
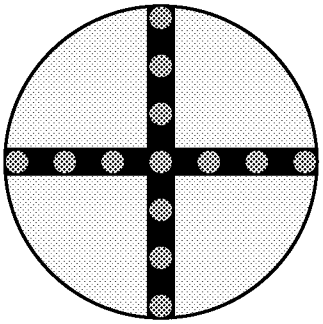

FIGS. 7A-7D are schematical diagrams illustrating the integration of nanothermometers with a wafer according to some embodiments of the present disclosure. As shown in FIG. 7A, a wafer 790, e.g., the wafer 190, with scribe lines 730 can be provided, cleaned, functionalized, treated, modified, etc. As shown in FIG. 7B, nanoparticles 791, e.g., the nanoparticles 191, can be attached to or embedded into the surface of the wafer 790. As shown in FIG. 7C, excess nanoparticles 791 that are not within the scribe lines 730 can be removed. As shown in FIG. 7D, the nanoparticles 791 can be coated on the surface of the wafer 790 using ALD/CVD process, for example.

Experimental results demonstrate the feasibility and applicability of the present disclosure are shown as follows.

Figure 8A:
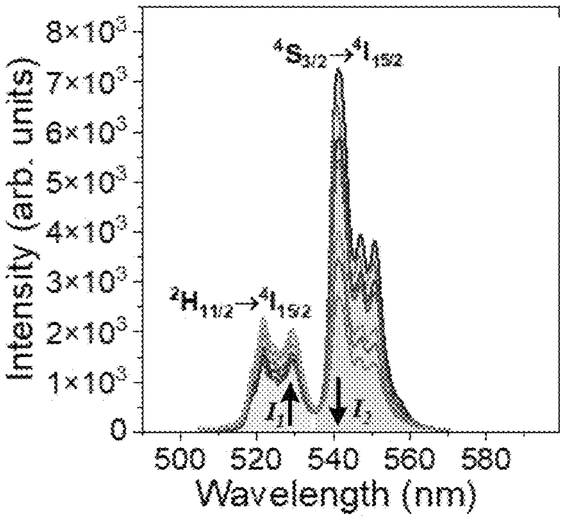
FIGS. 8A-8D demonstrate single point luminescent nanothermometers encapsulated with polymethyl methacrylate (PMMA) and spin-on-glass (SOG) films operating in air, vacuum, deionized water (DIW), isopropyl alcohol (IPA) and acid/base solution without rigorous calibration according to some embodiments of the present disclosure.
Figure 8B:
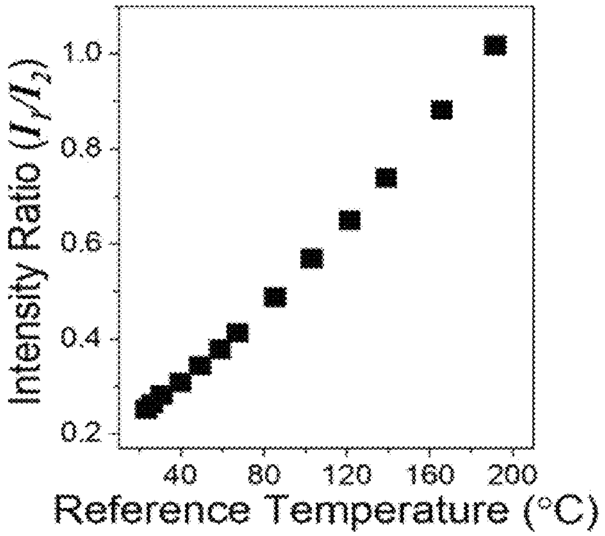
Figure 8C:
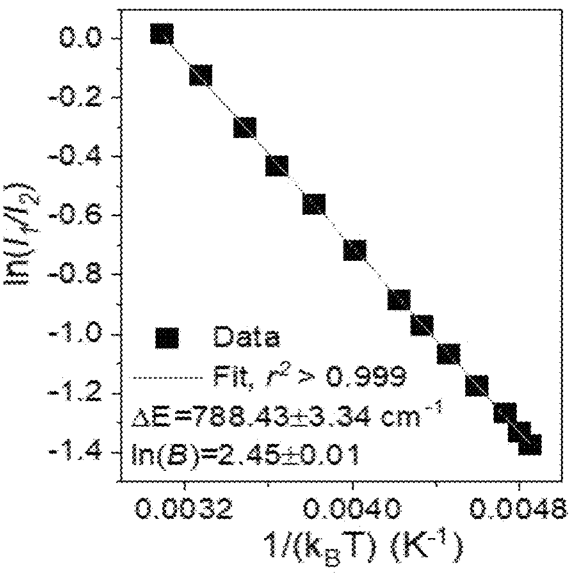
Figure 8D:
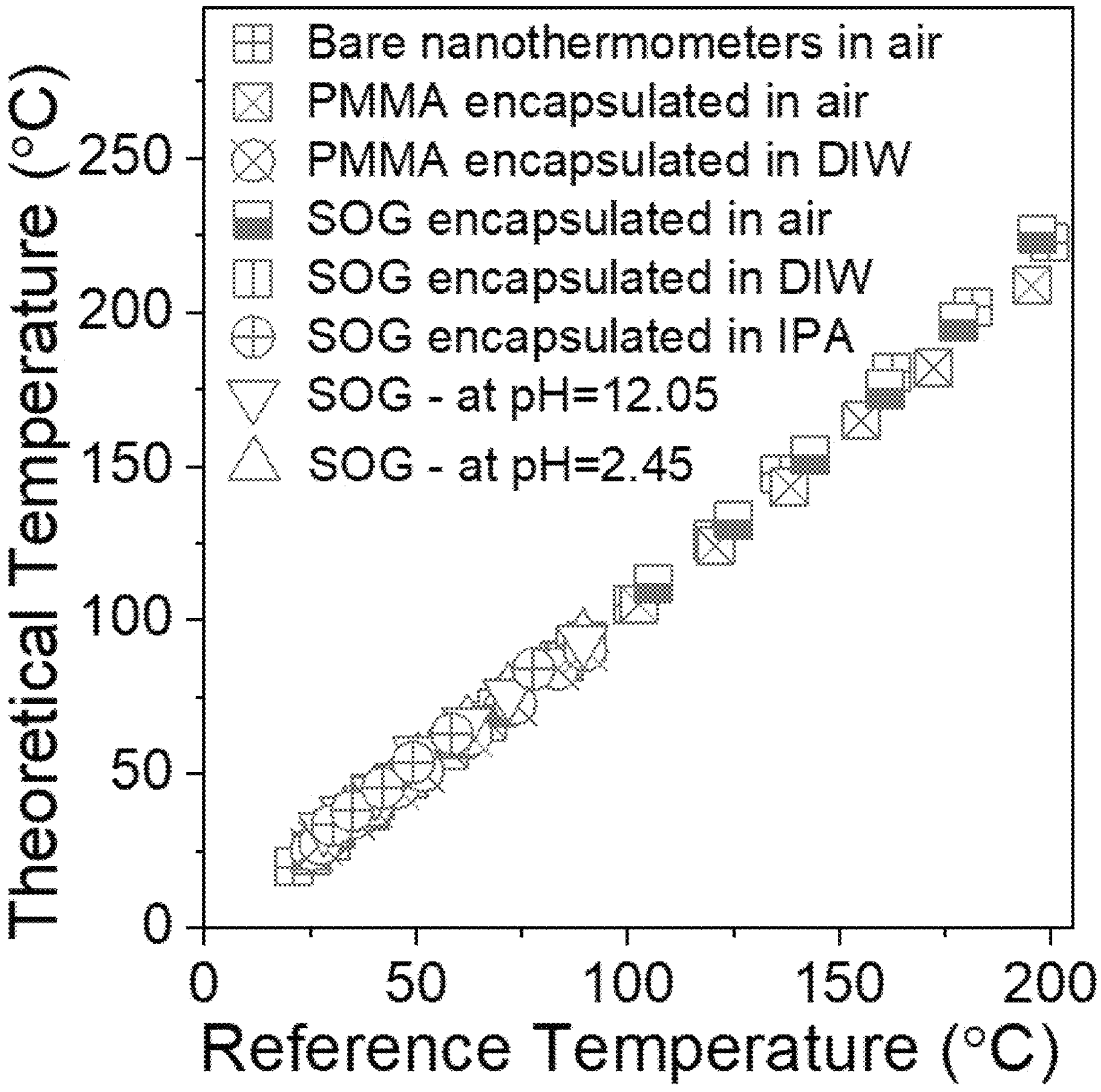

FIGS. 8A-8D demonstrate single point luminescent nanothermometers encapsulated with polymethyl methacrylate (PMMA) and spin-on-glass (SOG) films operating in air, vacuum, deionized water (DIW), isopropyl alcohol (IPA) and acid/base solution without rigorous calibration. FIG. 8A shows representative temperature dependent $Er^{+3}$ upconversion emission spectra of $NaYF_4$:Yb/Er nanothermometers integrated with Si coupons upon a 980 nm continuous wave diode laser illumination. For example, the emission spectra include seven spectral lines (from bottom to top depicted by first intensities $I_1$ and from top to bottom depicted by second intensities $I_2$) that correspond to 23.3, 30.7, 49.1, 67.4, 103.2, 139.1 and 191.1° C., respectively. FIG. 8B shows the corresponding integrated emission intensity ratio between the $^2H_{11/2}\rightarrow{}^4I_{15/2}$ and $^4S_{11/2}\rightarrow{}^4I_{15/2}$ spectral regions depicted by first intensities $I_1$ and the second intensities $I_2$, respectively, with the temperature measurement capabilities above the current SensArray operating range, i.e., 20-140° C. FIG. 8C shows the calibration curve to determine the energy separation between the two emission bands and the pre-exponential constant B. FIG. 8D shows the temperatures measured by bare and PMMA and SOG encapsulated $NaYF_4$:Yb/Er nanothermometers operating in air, vacuum, deionized water (DIW), isopropyl alcohol (IPA) and acid/base solution without rigorous calibration.

Figure 9:
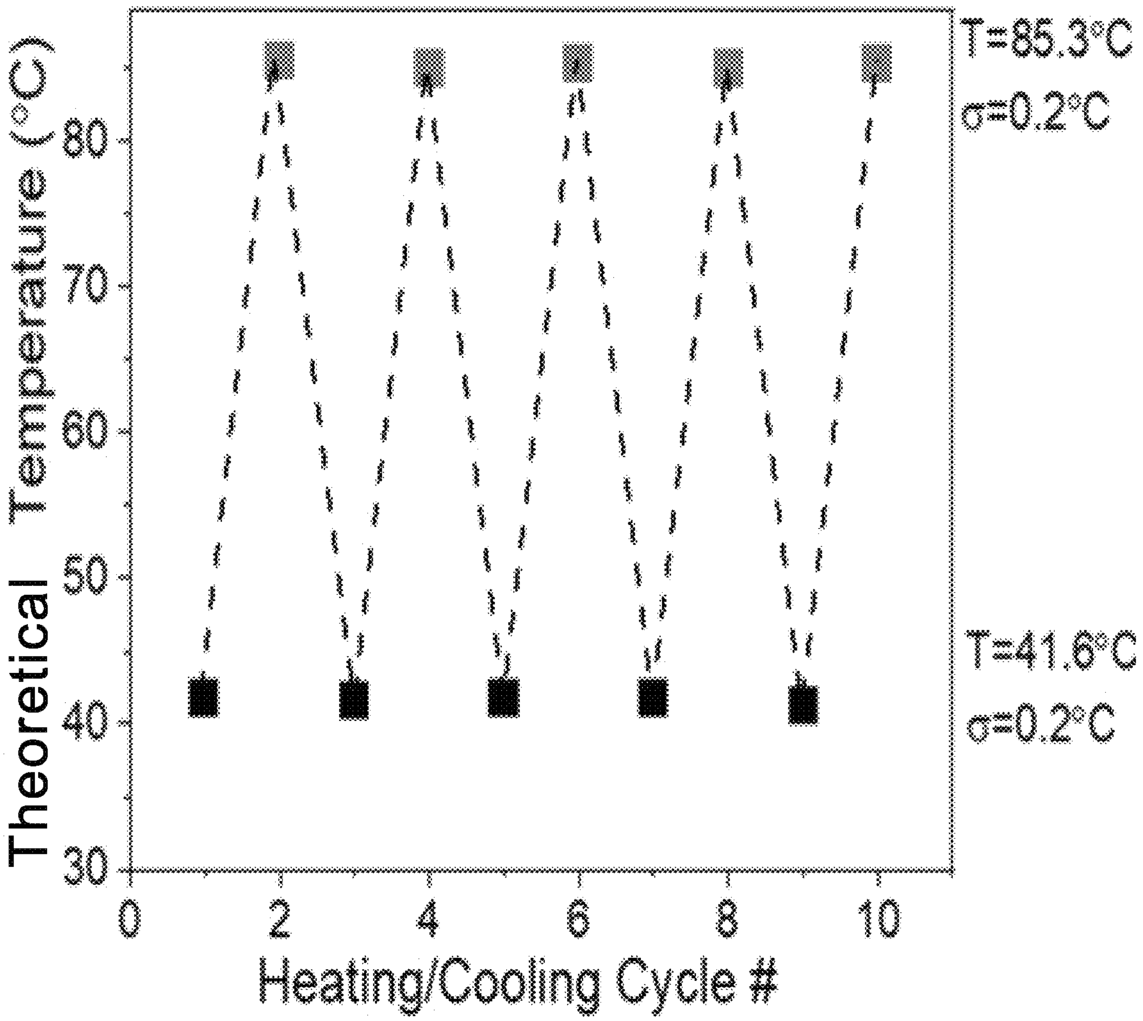
FIG. 9 demonstrates measurement reliabilities that are with excellent repeatability, stability and compatibility and temperature accuracy according to some embodiments of the present disclosure.

FIG. 9 demonstrates measurement reliabilities that are with excellent repeatability, stability and compatibility and temperature accuracy. As shown, when cycling heating and cooling of the integrated nanothermometers are at average temperatures 41.6° C. and 85.3° C., respectively, the corresponding repeatability is >99.99% for 10 consecutive cooling and heating cycles.

Figure 10A:
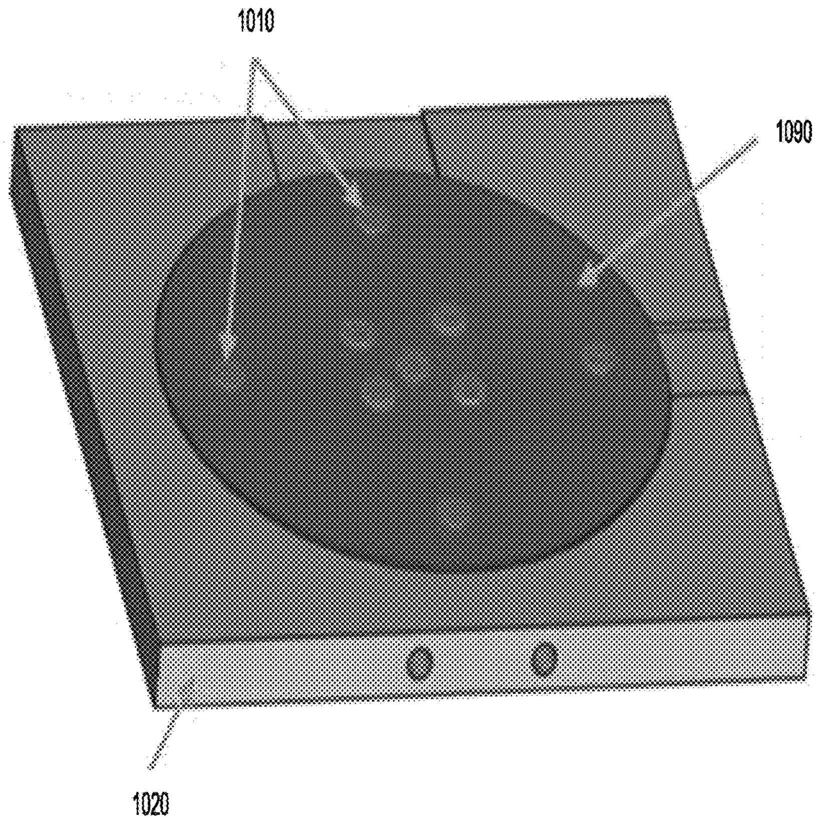
FIGS. 10A-10C demonstrate full wafer temperature mapping capability that are with multipoint temperature sensors integrated with a bare Si wafer according to some embodiments of the present disclosure.
Figure 10B:
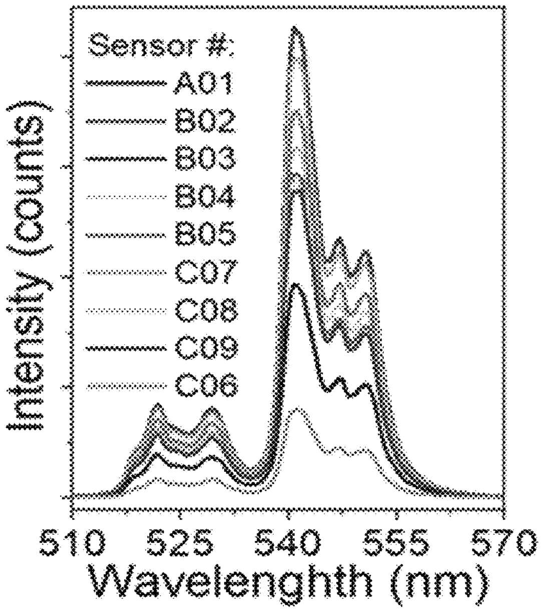
Figure 10C:
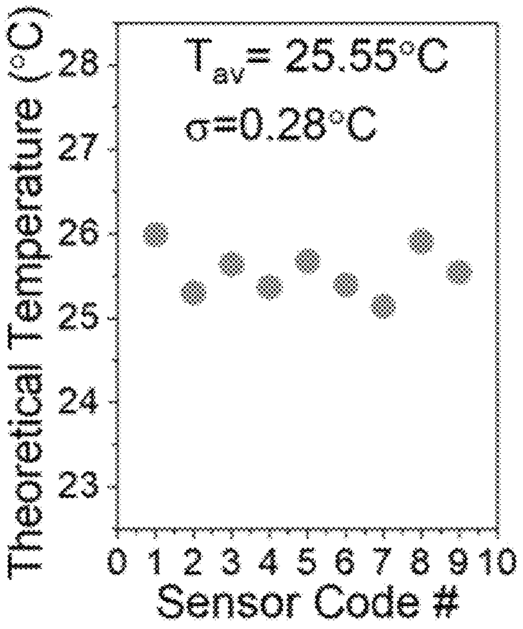

FIGS. 10A-10C demonstrate full wafer temperature mapping capability that are with multipoint temperature sensors integrated with a 4" bare Si wafer according to some embodiments of the present disclosure. FIG. 10A schematically shows multiple integrated luminescent temperature sensor locations (e.g., nine) 1010 on a 4" wafer 1090 (e.g., the wafer 190) for real-time full wafer temperature mapping by a wafer heater 1020. FIG. 10B shows emission spectra from the nine sensors locations. FIG. 10C shows the corresponding center to edge computed temperature profile at room temperature (25.8° C.).

Figure 11:
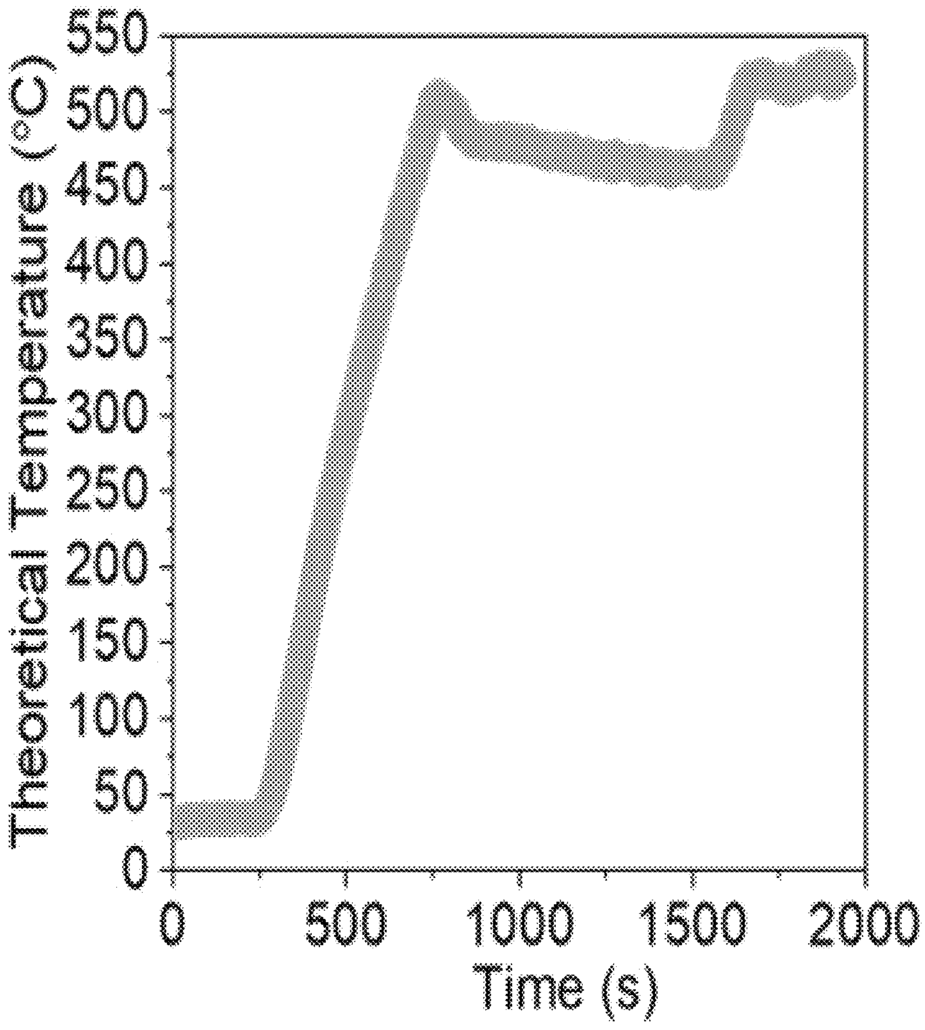
FIG. 11 demonstrates an example of integrating the method with existing tools and real-time high temperature monitoring demonstrated using a R & D vacuum annealing chamber according to some embodiments of the present disclosure.

FIG. 11 demonstrates an example of integrating the method with existing tools and real-time high temperature monitoring demonstrated using a R & D vacuum annealing chamber according to some embodiments of the present disclosure. FIG. 11 shows real-time high temperature monitoring using spin-on glass encapsulated upconversion nanothermometers in vacuum ($1e^{-5}$ Torr) during the ramp up of 2"-heating stage. The theoretical temperature readout using the luminescent spectra reflects the actual temperature dynamics of the PID controller response to the different setpoint temperatures.

In an embodiment, $NaYF_4$:Yb/Er upconversion microparticles in powder form with average size 1 μm (Sigma Aldrich) and aqueous colloidal solutions of bare $NaYF_4$:Yb/Er nanoparticles with average size 25 nm (Sigma Aldrich) and silica coated core-shell NaYF4:Yb/Er@$NaYF_4$ nanoparticles with average size 50 nm (Sigma Aldrich) are used. In another embodiment, ethyl acetate, polymethylmethacrylate—PMMA ($M_w$=350,000, Sigma-Aldrich), spin-on glass solution—SOG (512B, Honeywell), isopropyl alcohol—IPA, deionized water—DIW (Fisher Scientific), hydrochloric acid and potassium hydroxide are used.

The integration of the nanothermometers with a process wafer is described as follows.

Deposition of the thermometers:—The micro-thermometers and nanothermometers are integrated with bare Si coupons, thermal $SiO_2$ coated Si coupons and 4" bare Si wafers using drop casting and spin coating methods. The coupons with 1.5×1.5 $cm^2$ and the wafers are rinsed in IPA, blow dried and dried on a hot plate at 75° C. for 2 min. Then, an aqueous solution of the thermometers (10 μL, 5 mg/mL) are drop casted on the preheated coupons and wafers at 75° C. allowing for evaporation of the solvent and leaving a thin layer of deposited luminescent thermometers over an area of about 5 mm diameter. The concentration and/or thickness of the deposited thermometers can be increased and adjusted using cyclic or multiple deposition of the aqueous solution of the thermometers. The coupons and wafers are heated at 150° C. for 5 min to remove the water content from the deposited thermometers.

Encapsulation of the thermometers:—polymethyl methacrylate (PMMA) and spin-on-glass (SOG) coatings are used to encapsulate the deposited thermometers on the coupons and wafers. In case of PMMA, drop casting, dip-coating, and spin coating processes can be applied. In one example, 50 μL of 2% w/v PMMA in ethyl acetate is drop casted on the deposited thermometers at room temperature and the solvent is allowed to evaporate followed by baking on a hot plate in the 150° C.-250° C. range for 15 min. On the other hand, SOG encapsulation is achieved through spin coating. On a typical coating, 50 μL of the SOG solution is dispensed on the deposited thermometers and the solvent is evaporated during the spinning at 1500 rpm for 30 s. The SOG film is then baked at 250° C. in air and cured at 450° C. in vacuum. The thickness of the SOG film can be tuned by adjusting the spin speed and/or using multistep coatings.

In an embodiment, a detection system for luminescent and temperature measurements may include any photon detector devices coupled with lens, mirrors and/or optical fibers. The illumination sources can include LED, lasers and lamps that can be coupled to optical fibers. In some embodiments, the emission spectra of the nanothermometers can be collected using Maya2000Pro portable spectrometer (Ocean Insight) coupled with a 1-meter-long optical fiber with 600 μm core diameter (QP600-1-UV-VIS, Ocean Insight). A customized MATLAB graphical user interface can be used for controlling the spectrometer and real-time temperature data acquisitions. A continuous wave diode laser (MDL-H-980) with emission wavelength centered at 980 nm and maximum outpower of 5 W controlled by a PSU-H-LED power supply (Opto Engine LLC) can be used as an illumination source. The laser beam is guided with a 1-meter long 400 μm core diameter high power optical fiber. The laser illumination spot diameter on the coupon ranges between 5-10 mm depending on the focal length of the collimating lens used or the distance between the wafer surface and the fiber end.

For measurements in solutions, coupons with the integrated thermometers are soaked in a 30×30×70 $mm^3$ quartz cuvette filled with the selected solutions. A reference thermocouple is attached to the coupon close to the deposited thermometers. A thermally conductive double-sided tape (TCDT1, Thorlabs) is used for an effective thermal contact between the cuvette and a custom-made heating plate with two insertion holes for cartridge heating elements controlled by a PID controller. The temperature is set at the desired setpoint, and a minimum of 10 minutes was given to reach thermal equilibrium. Temperature dependent upconversion emission spectra of the nanothermometers are collected at different equilibrium temperatures. Real-time and dynamic temperature profiles can also be measured during the ramp up.

The present disclosure presents integrated wafer-nanothermometer platform which can offer real-time and remote monitoring of actual wafer temperature during processing, can measure temperature at great spatial, temporal and temperature resolutions, can be easily embedded into unused part of a process wafer: scribe lines, front/back sides, edges, alignment markers, patterned features, etc., can be used to measure wide range of temperature, can operate in harsh process conditions such as plasma process, corrosive environment and high-speed motions, and can be easily integrated with existing tools with minor or no modifications, and can measure absolute local temperatures with nanoscale spatial precision, suitable for temperature profile determination in small features such as critical dimensions (CDs). The present disclosure presents a self-calibrating wafer temperature measurement method, i.e., it does not require wafer to wafer, tool to tool, chamber to chamber etc. temperature calibrations.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding.

Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the present disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the present disclosure. Such variations are intended to be covered by the scope of this disclosure. As such, the foregoing descriptions of embodiments of the present disclosure are not intended to be limiting. Rather, any limitations to embodiments of the present disclosure are presented in the following claims.

What is claimed is:

1. A semiconductor structure, comprising:

a wafer; and luminescent thermometers formed on a surface of the wafer, the luminescent thermometers configured to receive incident light and emit light, the emitted light having an intensity that depends on a temperature of a portion of the surface of the wafer where the luminescent thermometers are formed, wherein the wafer has a scribe line and/or an alignment marker formed on the surface thereof, and the luminescent thermometers are formed on the surface within the scribe line and/or the alignment marker.

2. The semiconductor structure of claim 1, wherein the luminescent thermometers include rare-earth (RE) ions doped oxides, fluorides, aluminates, phosphates, silicates, titanates, vanadates, borates, chlorides, oxysulfides and/or oxyfluorides.

3. The semiconductor structure of claim 2, wherein the luminescent thermometers include $YO_2O_3$:RE, $Sc_2O_3$:RE, $La_2O_3$:RE, $Gd_2O_3$:RE, $HfO_2$:RE, $ZrO_2$:RE, ZnO:RE, $Ta_2O_5$:RE, $Al_2O_3$:RE, $TiO_2$:RE, $NaYF_4$:RE, $CaF_2$:RE, $SrF_2$:RE, $YPO_4$:RE, $YBO_4$:RE, $YAlO_3$:RE, $YVO_4$:RE and/or $YCO_3$:RE, where RE denotes single or combination of different rare-earth ions.

4. The semiconductor structure of claim 3, wherein the rare-earth includes $Y^{3+}$, $Sc^{3+}$, $La^{3+}$, $Ce^{3+}$, $Pr^{3+}$, $Nd^{3+}$, $Eu^{3+}$, $Gd^{3+}$, $Dy^{3+}$, $Tb^{3+}$, $Ho^{3+}$, $Er^{3+}$, $Tm^{3+}$, $Yb^{3+}/Er^{3+}$, $Yb^{3+}/Tm^{3+}$, $Yb^{3+}/Tm^{3+}/Er^{3+}$, $Yb^{3+}/Ho^{3+}$, $Yb^{3+}/Ho^{3+}/Er^{3+}$, $Yb^{3+}/Ho^{3+}/Tm^{3+}$ and/or $Yb^{3+}/Tb^{3+}$.

5. The semiconductor structure of claim 1, wherein the wafer has the scribe line, and the luminescent thermometers are formed on the surface within the scribe line.

6. The semiconductor structure of claim 1, wherein the wafer has the alignment marker, and the luminescent thermometers are formed on the surface within the alignment marker.

7. The semiconductor structure of claim 1, wherein the incident light includes ultra-violet (UV), visible (Vis) and/or infrared (IR) light.

8. The semiconductor structure of claim 1, further comprising:

an encapsulation film formed on the surface of the wafer to cover the luminescent thermometers.

9. A method of forming a semiconductor structure, comprising:

providing a wafer; and forming luminescent thermometers on a surface of the wafer, the luminescent thermometers configured to receive incident light and emit light, the emitted light having an intensity that depends on a temperature of a portion of the surface of the wafer where the luminescent thermometers are formed, wherein forming luminescent thermometers includes attaching the luminescent thermometers to the surface of the wafer through self-assembly, electrostatic interactions and/or chemical bonding using surface functionalization of the luminescent thermometers and/or the wafer.

10. The method of claim 9, wherein forming luminescent thermometers includes attaching the luminescent thermometers to the surface of the wafer through self-assembly.

11. The method of claim 9, wherein forming luminescent thermometers includes attaching the luminescent thermometers to the surface of the wafer through electrostatic interactions.

12. The method of claim 11, wherein the luminescent thermometers are dispersed in a solvent, and wherein the solvent includes isopropyl alcohol (IPA), methanol, ethanol, ethyl acetate, chloroform, or cyclohexane.

13. The method of claim 9, wherein forming luminescent thermometers includes attaching the luminescent thermometers to the surface of the wafer through chemical bonding using surface functionalization of the luminescent thermometers and/or the wafer.

14. The method of claim 9, further comprising:

forming an encapsulation film on the surface of the wafer to cover the luminescent thermometers.

15. The method of claim 9, wherein the luminescent thermometers are formed using atomic layer deposition (ALD) or chemical vapor deposition (CVD) techniques.

16. The method of claim 15, wherein the ALD technique is achieved using rare-earth/metal precursors and oxygen and fluorine gas precursors.

17. The method of claim 16, wherein the rare-earth/metal precursors include rare-earth complexes of β-diketonate, alkoxides, organometallics or amides, and the oxygen and fluorine gas precursors include $O_2$, $O_3$, $H_2O_2$ vapor, $H_2O$ vapor, or $F_2$.

* * * * *